United States Patent
Hasegawa et al.

(10) Patent No.: US 8,987,604 B2
(45) Date of Patent: Mar. 24, 2015

(54) WIRING SUBSTRATE, MULTI-PIECE WIRING SUBSTRATE, AND METHOD FOR PRODUCING SAME

(75) Inventors: Masami Hasegawa, Konan (JP); Satoshi Hirayama, Ichinomiya (JP); Naoki Kito, Nagoya (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 36 days.

(21) Appl. No.: 14/110,680

(22) PCT Filed: Feb. 1, 2012

(86) PCT No.: PCT/JP2012/000660
§ 371 (c)(1),
(2), (4) Date: Oct. 8, 2013

(87) PCT Pub. No.: WO2012/144114
PCT Pub. Date: Oct. 26, 2012

(65) Prior Publication Data
US 2014/0034369 A1  Feb. 6, 2014

(30) Foreign Application Priority Data
Apr. 20, 2011  (JP) ................. 2011-093581

(51) Int. Cl.
*H05K 1/03* (2006.01)
*H05K 1/02* (2006.01)
(Continued)

(52) U.S. Cl.
CPC ............. *H05K 1/02* (2013.01); *H05K 1/0306* (2013.01); *H05K 3/0029* (2013.01);
(Continued)

(58) Field of Classification Search
CPC .. H05K 1/0306; H05K 3/0026; H05K 3/0029
See application file for complete search history.

(56) References Cited

U.S. PATENT DOCUMENTS

| | | |
|---|---|---|
| 6,498,319 B1 | 12/2002 | Matsumoto et al. |
| 2008/0135155 A1 | 6/2008 | Kawamura et al. |

(Continued)

FOREIGN PATENT DOCUMENTS

| | | |
|---|---|---|
| CN | 101347058 A | 1/2009 |
| JP | 2009-218319 A | 9/2009 |

(Continued)

OTHER PUBLICATIONS

Taiwan Intellectual Property Office, Notification for the Opinion of Examination, issued in corresponding Taiwanese application No. 101113883, mailed Oct. 23, 2014.

(Continued)

*Primary Examiner* — Jeremy C Norris
(74) *Attorney, Agent, or Firm* — Stites & Harbison PLLC; Jeffrey A. Haeberlin (57) ABSTRACT

Provided are a ceramic wiring substrate having a side surface which realizes reliable chucking or hooking; a multi-piece wiring substrate array for providing a plurality of the wiring substrates; and a method for reliably producing the multi-piece wiring substrate array. The wiring substrate is formed of a ceramic material, has a square (rectangular) shape in plan view, and which has a front surface, a back surface, and side surfaces each being located between the front surface and the back surface, wherein each side surface has a belt-like uneven surface including a plurality of alternate and parallel convex portions and concave portions which are formed so as to extend along the front surface, and also has a fracture surface located on a side toward the back surface.

4 Claims, 4 Drawing Sheets

(51) Int. Cl.
*H05K 3/00* (2006.01)
*H05K 3/10* (2006.01)

(52) U.S. Cl.
CPC ..... *H05K 3/0052* (2013.01); *H05K 2201/0909* (2013.01); *H05K 2201/09154* (2013.01); *H05K 2203/1476* (2013.01); *H05K 3/10* (2013.01)
USPC .......................................................... 174/255

(56) References Cited

U.S. PATENT DOCUMENTS

2008/0142147 A1    6/2008    Kawamura et al.
2009/0220721 A1    9/2009    Matsusaki
2011/0315439 A1    12/2011   Nakashima

FOREIGN PATENT DOCUMENTS

JP    2011-009400 A    1/2011
WO    2008018227 A1   2/2008

OTHER PUBLICATIONS

European Patent Office, Supplementary European Search Report, issued in corresponding European application No. 12774076.9, dated Dec. 17, 2014.

JPO/ISR, International Search Report issued in corresponding international application PCT/JP2012/000660, mailed May 22, 2012.

WIRING SUBSTRATE, MULTI-PIECE WIRING SUBSTRATE, AND METHOD FOR PRODUCING SAME

TECHNICAL FIELD

The present invention relates to a wiring substrate having a side surface which provides reliable chucking, etc. during conveyance thereof; to a multi-piece wiring substrate array for providing a plurality of the wiring substrates; and to a method for producing the multi-piece wiring substrate array.

BACKGROUND ART

Generally, ceramic wiring substrates are produced by dividing a multi-piece ceramic wiring substrate array into individual wiring substrates along dividing grooves provided on a front surface or a back surface of the wiring substrate array. In connection therewith, there has been proposed a method for producing a multi-piece wiring substrate array, in which a blade having a specific edge angle is pressed against a surface of a green sheet laminate at positions where dividing grooves are to be formed, so that breakage, burrs, etc. are less likely to occur at a metal layer located in a vicinity of the thus-formed dividing grooves during formation of individual wiring substrates from the substrate array (see, for example, Patent Document 1).

In the case where dividing grooves are formed by means of a blade in a multi-piece wiring substrate array through the multi-piece wiring substrate array production method described in Patent Document 1, when the multi-piece wiring substrate array is divided into individual wiring substrates, each side surface of each wiring substrate has a relatively smooth groove surface (i.e., a surface corresponding to each dividing groove formed by the blade) at a portion in the vicinity of a front surface or a back surface of the wiring substrate, as well as a ceramic fracture surface located at a middle portion of the side surface in a thickness direction. Therefore, when a chucking apparatus is employed for conveying each wiring substrate by means of a pair of opposing claws of the apparatus, since each claw tends to slip on a smooth groove surface of the corresponding side surface of the wiring substrate when the claw comes into contact with the groove surface, chucking of the wiring substrate may fail to be achieved. Alternatively, a special chucking apparatus having long claws is required for chucking of each wiring substrate at its fracture surface.

Meanwhile, when individual wiring substrates are to be positioned in each of a plurality of dents of a product tray by means of a positioning jig after insertion of the wiring substrates in the dent, since the positioning jig may slip on a smooth groove surface of each side surface of a wiring substrate due to slight vibration, positioning of the wiring substrates in the dent may fail to be achieved. In the worst case, there may arise a problem in that some wiring substrates jump out of the dent.

PRIOR ART DOCUMENT

Patent Document

Patent Document 1: Japanese Patent Application Laid-Open (kokai) No. 2009-218319 (pp. 1 to 11, FIGS. 1 to 8)

SUMMARY OF THE INVENTION

Problems to be Solved by the Invention

An object of the present invention is to solve problems described in the Background Art section, and to provide a ceramic wiring substrate having a side surface which provides reliable chucking or hooking. Another object of the present invention is to provide a multi-piece wiring substrate array for providing a plurality of the wiring substrates. Yet another object of the present invention is to provide a method for reliably producing the multi-piece wiring substrate array.

Means for Solving the Problems

In order to solve the aforementioned problems, the present invention has been achieved on the basis of the idea that an uneven surface is formed on at least a portion of each side surface of a wiring substrate, and on at least a portion of a pair of inner wall surfaces of each dividing groove formed in a multi-piece wiring substrate array.

Accordingly, the present invention provides a wiring substrate (claim 1) which is formed of a ceramic material, which has a rectangular shape in plan view, and which has a front surface, a back surface, and side surfaces each being located between the front surface and the back surface, the wiring substrate being characterized in that each side surface has a belt-like uneven surface including a plurality of alternate and parallel convex portions and concave portions which are formed so as to extend along the front surface and the back surface.

Examples of the aforementioned ceramic material include high-temperature fired ceramic materials such as alumina and mullite, and low-temperature fired ceramic materials such as glass-ceramic materials. The ceramic wiring substrate may be formed of a single ceramic layer, or of a ceramic laminate including a plurality of ceramic layers.

The wiring substrate also encompasses an embodiment wherein each side surface has only the aforementioned uneven surface, and an embodiment wherein each side surface has both the uneven surface and a below-described ceramic fracture surface.

Each concave portion of the uneven surface has an arc-shaped cross section, and a convex portion sandwiched between two arc-shaped concave portions has a short and generally wave-shaped cross section.

The wiring substrate also encompasses an embodiment wherein a side surface has a notch extending in a thickness direction and having a semicircular shape in plan view, and a conductor layer provided on the inner wall of the notch; and an embodiment wherein a notch having a quarter arc shape in plan view and provided at a corner formed by a pair of adjacent side surfaces, and a conductor layer provided on the inner wall of the notch.

The present invention also encompasses a wiring substrate (claim 2) wherein each side surface has a belt-like uneven surface including a plurality of alternate and parallel convex portions and concave portions which are formed so as to extend along at least one of the front surface and the back surface, and a fracture surface located between the uneven surface and the front surface or the back surface, or between a pair of uneven surfaces provided on the side surface and located on both sides toward the front surface and the back surface. There is exposed, on the ceramic fracture surface of the side surface, an end surface of a wire for plating which is electrically conducted to internal wiring of the wiring substrate.

The present invention also encompasses a wiring substrate (claim 3) wherein the uneven surface of each side surface has a width which is 30% or less of the overall thickness between the front surface and the back surface.

The present invention also provides a multi-piece wiring substrate array (claim 4), comprising a product region which is formed of a ceramic material, which has a front surface and a back surface and has a rectangular shape in plan view, and which has a plurality of wiring substrate units that are adjacently arranged in a matrix form; an edge portion which is formed of the ceramic material, which is located around the product region, and which has a front surface and a back surface and has a rectangular frame shape in plan view; and dividing grooves which are formed on at least one of a front surface and a back surface of the wiring substrate array and are arranged in a lattice shape in plan view, and which are provided between adjacent wiring substrate units and between the product region and the edge portion, the multi-piece wiring substrate array being characterized in that each of the dividing grooves has a pair of inner wall surfaces, and each of the paired inner wall surfaces has an uneven surface including a plurality of alternate and parallel convex portions and concave portions which are formed so as to extend in a longitudinal direction of the dividing groove. A virtual surface at a position where dividing is to be performed, the surface being other than one or both of the front-surface-side dividing groove and the back-surface-side dividing groove, becomes the aforementioned fracture surface during shearing of the wiring substrate array along the dividing grooves.

The present invention also provides a method for producing a multi-piece wiring substrate array (claim 5), the multi-piece wiring substrate array comprising a product region which is formed of a ceramic material, which has a front surface and a back surface and has a rectangular shape in plan view, and which has a plurality of wiring substrate units that are adjacently arranged in a matrix form; an edge portion which is formed of the ceramic material, which is located around the product region, and which has a front surface and a back surface and has a rectangular frame shape in plan view; and dividing grooves which are formed on at least one of a front surface and a back surface of the wiring substrate array and are arranged in a lattice shape in plan view, and which are provided between adjacent wiring substrate units and between the product region and the edge portion, characterized in that the method comprises: a step of forming a plurality of dividing grooves in at least one of a front surface and a back surface of a green sheet which has a rectangular shape in plan view and which is to become the multi-piece wiring substrate array having the product region and the edge portion, by irradiating with a laser beam a plurality of times while scanning the laser beam thereon, so that the dividing grooves are provided around a portion of the green sheet corresponding to the wiring substrate units and between portions of the green sheet corresponding to the product region and the edge portion, and so that the dividing grooves are arranged in a lattice shape in plan view, wherein a plurality of laser irradiation processes are carried out while gradually shifting the focal point of the laser beam so that the depth of the focal point, as measured from the front surface or back surface of the green sheet, in a laser irradiation process is greater than that in the preceding laser irradiation process. The green sheet may be formed of a single layer, or may be formed by stacking a plurality of layers.

The aforementioned laser irradiation processes are carried out at least twice.

The aforementioned dividing groove formation step through laser irradiation is preceded by a step of forming a through hole in a green sheet, a step of charging an electrically conductive paste into the through hole and applying the paste (through printing) to the front surface or the back surface of the green sheet, and a step of stacking a plurality of green sheets.

The aforementioned dividing groove formation step is followed by a step of firing the green sheet or a green sheet laminate, and a step of electroplating the thus-fired ceramic wiring substrate array. The electroplating step is followed by a step of dividing the wiring substrate array into individual wiring substrates along the dividing grooves.

Effects of the Invention

According to the wiring substrate of claim 1, since each of four side surfaces has a belt-like uneven surface including a plurality of alternate and parallel convex portions and concave portions which are formed so as to extend along the front surface and the back surface, even when relatively short claws of a chucking apparatus come into contact with the uneven surfaces of a pair of opposite side surfaces, chucking of the wiring substrate can be reliably achieved. In addition, since claws of a positioning jig are reliably hooked on the uneven surfaces, the wiring substrate can be accurately accommodated at a specific position in a dent of a product tray. Thus, the present invention can contribute to improvement of the productivity of ceramic wiring substrates.

According to the wiring substrate of claim 2, each of four side surfaces is in a form wherein an uneven surface is located on the side toward the front surface, and a fracture surface is located on the side toward the back surface; a form wherein a fracture surface is located on the side toward the front surface, and an uneven surface is located on the side toward the back surface; or a form wherein a pair of uneven surfaces are located on respective sides toward the front surface and the back surface, and a fracture surface is located between the paired uneven surfaces. Therefore, chucking of the wiring substrate can be reliably achieved by bringing a pair of relatively short claws of a chucking apparatus into contact with the uneven surfaces of a pair of opposite side surfaces. In addition, since claws of a positioning jig are reliably hooked on the uneven surfaces or the fracture surfaces, the wiring substrate can be accurately accommodated at a specific position in a dent of a product tray.

According to the wiring substrate of claim 3, each side surface has a fracture surface having a width which is 70% or more of the thickness of the wiring substrate, and an uneven surface adjacent to at least one of the front surface and the back surface and having a width which is 30% or less of the thickness of the wiring substrate. Therefore, there can be readily and reliably carried out sandwiching of the wiring substrate by bringing a pair of relatively short claws into contact with the uneven surfaces of the substrate (i.e., chucking of the wiring substrate), as well as accommodation of the wiring substrate by hooking claws of a positioning jig on the aforementioned uneven surfaces or relatively wide fracture surfaces.

According to the multi-piece wiring substrate array of claim 4, when the wiring substrate units of the product region are divided into individual pieces along the dividing grooves, there can be reliably produced a plurality of wiring substrates each having side surfaces having the aforementioned uneven surfaces.

According to the multi-piece wiring substrate array production method of claim 5, since a plurality of laser irradiation processes are carried out while gradually shifting the focal point of a laser beam so that the depth of the focal point, as measured from the front surface or back surface of a green sheet, in a laser irradiation process is greater than that in the preceding laser irradiation process, there can be produced a multi-piece wiring substrate array in which dividing grooves are reliably formed on at least one of the front surface and the back surface of a green sheet such that the aforementioned uneven surfaces provided on a pair of facing inner wall surfaces of each dividing groove are in line symmetry with each other.

MODES FOR CARRYING OUT THE INVENTION

Embodiments of the present invention will next be described.

Figure 1:
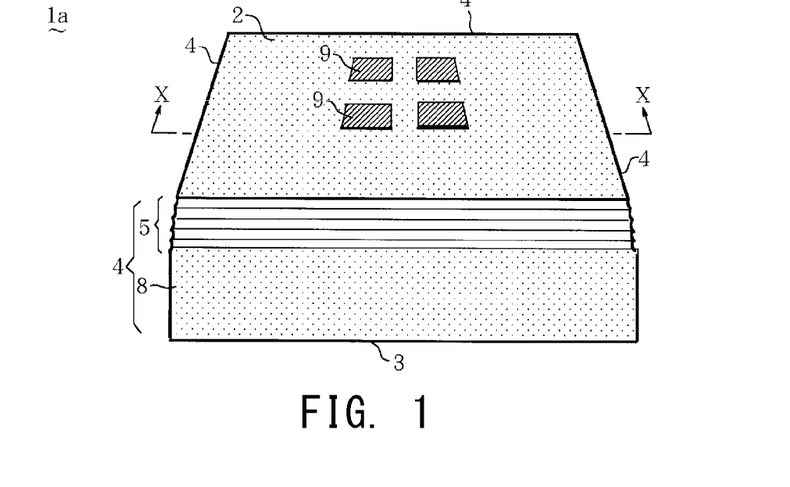
FIG. 1 is a perspective view of a wiring substrate according to one embodiment of the present invention, as viewed from obliquely upward.
Figure 2:
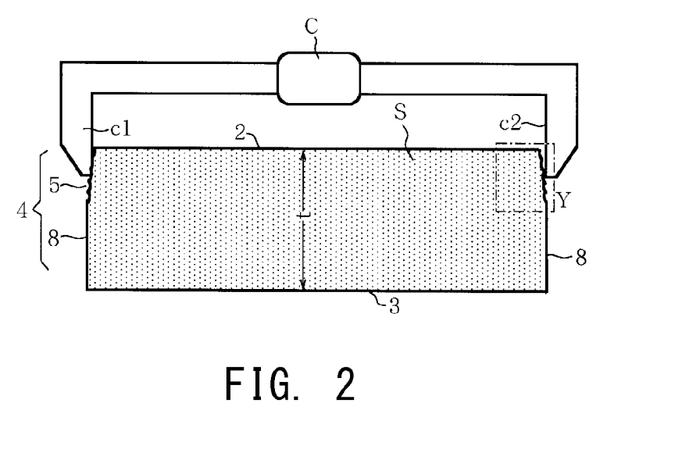
FIG. 2 is a vertical cross-sectional view of the wiring substrate of FIG. 1 taken along line X-X.
Figure 3:
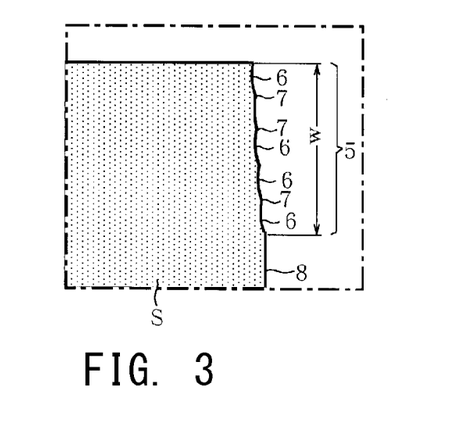
FIG. 3 is a partially enlarged view of a portion Y shown by dashed-dotted line in FIG. 2.

FIG. 1 is a perspective view of a wiring substrate 1a according to one embodiment of the present invention, as viewed from obliquely upward. FIG. 2 is a vertical cross-sectional view of the wiring substrate of FIG. 1 taken along line X-X. FIG. 3 is a partially enlarged view of a portion Y shown by dashed-dotted line in FIG. 2.

As shown in FIGS. 1 to 3, the wiring substrate 1a is formed of a ceramic laminate S, has a square (rectangular) shape in plan view, and has a front surface 2, a back surface 3, and four side surfaces 4 each being located between the front surface 2 and the back surface 3. Each side surface 4 has a belt-like uneven surface 5 including a plurality of alternate and parallel convex portions 7 and concave portions 6 which are formed so as to extend along the front surface 2, and also has a fracture surface 8 of the ceramic laminate S located between the uneven surface 5 and the back surface 3.

The ceramic laminate S is formed of a single ceramic layer or a plurality of ceramic layers. The ceramic laminate S is formed of, for example, a high-temperature fired ceramic material such as alumina, or a low-temperature fired ceramic material such as glass-ceramic material.

As shown in FIG. 3, each concave portion 6 forming the uneven surface 5 is open to the outside, is very shallow, and has an arc-shaped cross section. A convex portion 7 located between adjacent concave portions 6, 6 has a short waveshaped cross section. The uneven surface 5 is very slightly inclined from the fracture surface 8 toward the center of the front surface 2. The uneven surface 5 has a width w (in a thickness direction) which is 30% or less of the thickness t between the front surface 2 and the back surface 3 of the wiring substrate 1a. The uneven surface 5 has a center-line average surface roughness Ra (in a thickness direction) of about 2.0 to about 10.0 μm, which corresponds to an inner wall surface of each dividing groove formed in a below-described multi-piece wiring substrate array.

As shown in FIG. 2, a pair of opposite claws c1 and c2 of a chucking apparatus C, which come close to or separate from each other, are pressed against the uneven surfaces 5 of opposite side surfaces 4 of the wiring substrate 1a. Since each of the streaky uneven surfaces 5 includes the horizontally extending concave portions 6 and convex portions 7 which are alternately located, and has the aforementioned surface roughness, the claws c1 and c2 come into contact with and press against the uneven surfaces 5, 5 without slipping thereon. Therefore, the wiring substrate 1a can be reliably chucked by means of the chucking apparatus C, and can be conveyed to another position.

A plurality of pads 9 are provided at the center of the front surface 2, and an external terminal (not illustrated) is provided on the back surface 3. An end surface of a connection wire for plating (not illustrated), which is employed for electrical conduction to internal wiring, is exposed on the fracture surface 8. When the ceramic laminate S is formed of, for example, alumina, a conductor (e.g., the pad 9 or internal wiring) is formed of W or Mo, whereas when the ceramic laminate S is formed of, for example, glass-ceramic, the conductor is formed of Cu or Ag.

Figure 4:
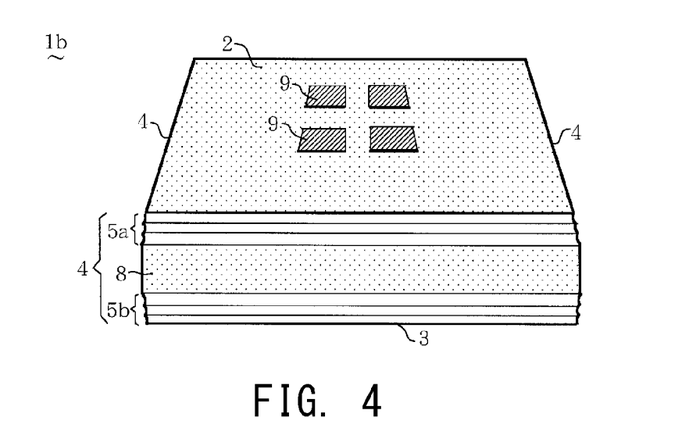
FIG. 4 is a perspective view of a wiring substrate, which is an applied embodiment of the aforementioned wiring substrate, as viewed from obliquely upward.

FIG. 4 is a perspective view of a wiring substrate 1b, which is an applied embodiment of the wiring substrate 1a, as viewed in a manner similar to that above. As in the aforementioned case, the wiring substrate 1b is formed of a ceramic laminate S, and, as shown in FIG. 4, the wiring substrate 1b has a front surface 2, a back surface 3, and side surfaces 4. Each side surface 4 of the wiring substrate 1b has a pair of uneven surfaces 5a and 5b which extend along the front surface 2 and the back surface 3, respectively, the uneven surfaces 5a and 5b having a structure similar to that described above, and a fracture surface 8 located between the uneven surfaces 5a and 5b and having a rectangular shape in side view. The paired uneven surfaces 5a and 5b are very slightly inclined from the fracture surface 8 toward the center of the front surface 2 and the center of the back surface 3, respectively.

According to the aforementioned wiring substrate 1a or 1b, since each side surface 4 has the belt-like uneven surface 5 including a plurality of the alternate and parallel convex portions 7 and concave portions 6 which are formed so as to extend along the front surface 2 or the back surface 3, the wiring substrate 1a or 1b can be reliably chucked by means of the chucking apparatus C by bringing relatively short claws c of the apparatus into contact with the uneven surfaces 5 (5a or 5b) of a pair of opposite side surfaces 4. In addition, since claws of a positioning jig are reliably hooked on the uneven surfaces 5, the wiring substrate 1a or 1b can be accurately accommodated at a specific position in a dent of a product tray. Furthermore, since each side surface 4 has the fracture surface 8 in addition to the uneven surfaces 5 (5a or 5b), a space for providing internal wiring can be readily secured.

Figure 5:
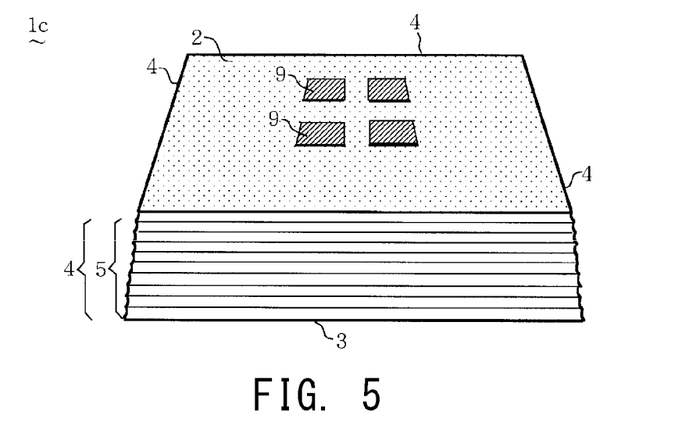
FIG. 5 is a perspective view of a wiring substrate according to another embodiment of the present invention, as viewed from obliquely upward.

FIG. 5 is a perspective view of a wiring substrate 1c according to another embodiment of the present invention, as viewed in a manner similar to that above.

As in the aforementioned case, the wiring substrate 1c is formed of a ceramic laminate S, and, as shown in FIG. 5, the wiring substrate 1c has a front surface 2, a back surface 3, and side surfaces 4. Each side surface 4 of the wiring substrate 1c has a belt-like uneven surface 5 including a plurality of alternate and parallel convex portions 7 and concave portions 6 which are formed so as to extend along the front surface 2 and the back surface 3. The uneven surface 5 forms the entirety of the side surface 4, and is very slightly tapered from the back surface 3 toward the front surface 2. Each side surface 4 has no fracture surface 8.

Figure 6:
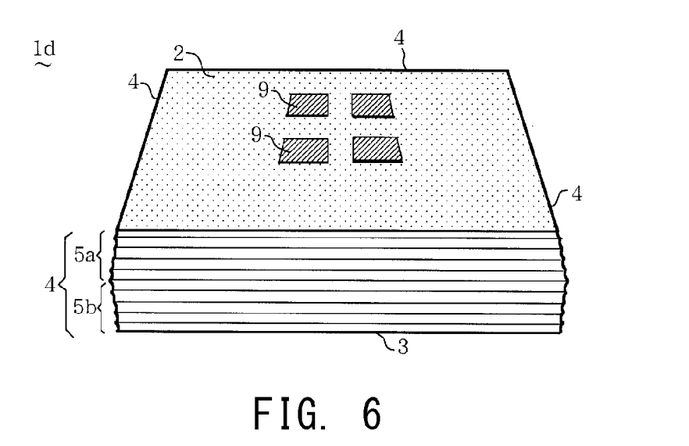
FIG. 6 is a perspective view of a wiring substrate, which is an applied embodiment of the aforementioned wiring substrate, as viewed from obliquely upward.

FIG. 6 is a perspective view of a wiring substrate 1d, which is an applied embodiment of the wiring substrate 1c, as viewed in a manner similar to that above. As in the aforementioned case, the wiring substrate 1d is formed of a ceramic laminate S, and, as shown in FIG. 6, the wiring substrate 1d has a front surface 2, a back surface 3, and side surfaces 4. Each side surface 4 of the wiring substrate 1d has belt-like uneven surfaces 5a and 5b including a plurality of alternate and parallel convex portions 7 and concave portions 6 which are formed so as to extend along the front surface 2 and the back surface 3. The uneven surfaces 5a and 5b form the entirety of the side surface 4, and are very slightly inclined (tapered) from the center (in a thickness direction) of the side surface 4 toward the center of the front surface 2 and the center of the back surface 3, respectively. These two tapered surfaces are attributed to the fact that, as described below, the laser irradiation process employed for forming dividing grooves in a multi-piece wiring substrate array corresponding to the wiring substrate 1d differs from that employed for forming dividing grooves in a multi-piece wiring substrate array corresponding to the wiring substrate 1c. Each side surface 4 has no fracture surface 8.

According to the aforementioned wiring substrate 1c or 1d, the above-described chucking can be readily and reliably carried out at any position of each side surface 4, and the above-described accurate positioning by means of the positioning jig can be readily achieved.

Figure 7:
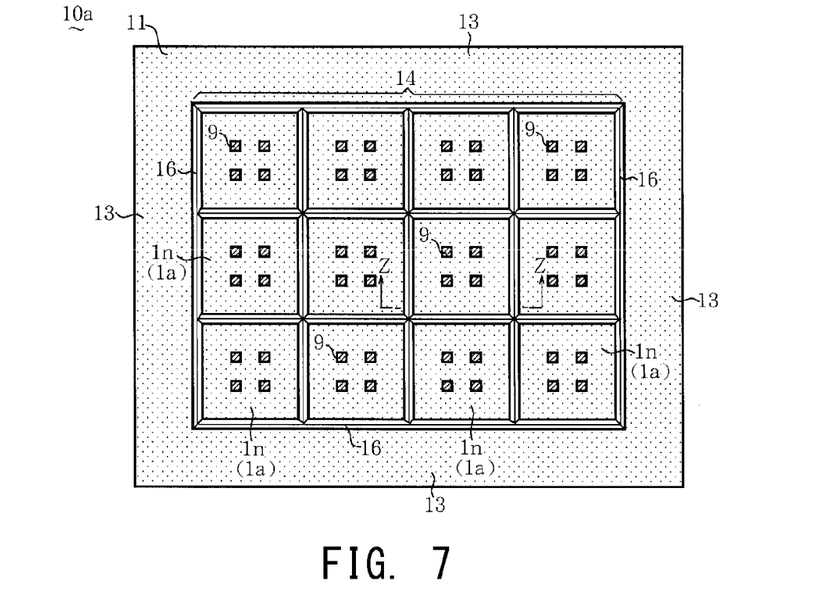
FIG. 7 is a schematic plan view of a multi-piece wiring substrate array according to one embodiment of the present invention.
Figure 8:
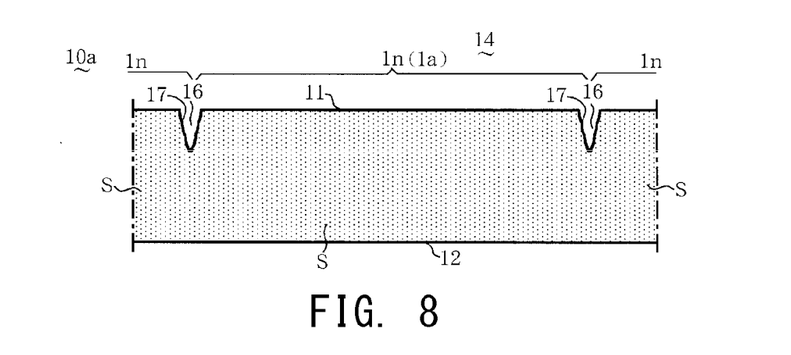
FIG. 8 is a partial, vertical cross-sectional view of the multi-piece wiring substrate array of FIG. 7 taken along line Z-Z.

FIG. 7 is a schematic plan view of a multi-piece wiring substrate array 10a according to one embodiment of the present invention, which is for providing the aforementioned wiring substrate 1a. FIG. 8 is a partial, vertical cross-sectional view of the multi-piece wiring substrate array of FIG. 7 taken along line Z-Z.

As shown in FIGS. 7 and 8, the multi-piece wiring substrate array 10a is formed of a ceramic laminate S similar to that described above, and includes a product region 14 which has a front surface 11 and a back surface 12 and has a square (rectangular) shape in plan view, and which has a plurality of wiring substrate units 1n that are adjacently arranged in a matrix form; an edge portion 13 which is located around the product region 14, and which has a front surface 11 and a back surface 12 and has a rectangular frame shape in plan view; and dividing grooves 16 which are formed on the front surface 11 and are arranged in a lattice shape in plan view, and which are provided between adjacent wiring substrate units 1n, 1n and between the product region 14 and the edge portion 13.

Each wiring substrate unit 1n is to become the aforementioned wiring substrate 1a through dividing of the multi-piece wiring substrate array into individual pieces. Each wiring substrate unit 1n has pads 9 similar to those described above which are formed on a center portion of the front surface 11.

The front surface 11 and the back surface 12 are common in the edge portion 13, the product region 14, and the wiring substrate units 1n.

As shown in FIG. 8, each dividing groove 16 has a V-shaped cross section, and each of a pair of opposite symmetrical inner wall surfaces 17 corresponds to the aforementioned uneven surface 5 in which a plurality of convex portions 7 and concave portions 6 are alternately provided in a depth direction and are parallel to one another in a longitudinal direction. Each dividing groove 16 has a depth which is 30% or less of the thickness between the front surface 11 and the back surface 12.

Figure 9:
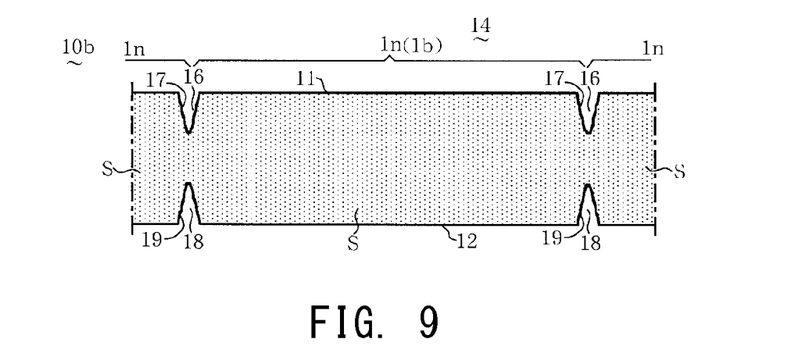
FIG. 9 is a partial, vertical cross-sectional view of a multi-piece wiring substrate array according to an applied embodiment, which is shown in a manner similar to that in FIG. 8.

FIG. 9 is a cross-sectional view of a multi-piece wiring substrate array 10b, which is an applied embodiment of the multi-piece wiring substrate array 10a, and which is shown in a manner similar to that above.

As shown in FIG. 9, the multi-piece wiring substrate array 10b is formed of a ceramic laminate S similar to that described above, and includes an edge portion 13, a product region 14 and dividing grooves 16 are formed on the front surface 11 which are similar to those described above. And also dividing grooves 18 are formed on the back surface 12 so as to be arranged in a lattice shape in plan view and to be in line symmetry with the dividing grooves 16. Each wiring substrate unit 1n is to become the aforementioned wiring substrate 1b through dividing of the multi-piece wiring substrate array into individual pieces. As in the case of the dividing grooves 16, each dividing groove 18 formed on the back surface 12 has a V-shaped cross section, and each of a pair of opposite symmetrical inner wall surfaces 19 corresponds to the aforementioned uneven surface 5b in which a plurality of convex portions 7 and concave portions 6 are alternately provided in a depth direction and are parallel to one another in a longitudinal direction.

According to aforementioned the multi-piece wiring substrate array 10a or 10b, when the wiring substrate units in of the product region 14 are divided into individual pieces along the dividing grooves 16 or 18, there can be reliably produced a plurality of wiring substrates 1a or 1b, each having side surfaces 4 having the aforementioned uneven surfaces 5.

Two or more electrodes for plating (not illustrated) are formed on each of a pair of long sides of the edge portion 13, and can be electrically conducted to the internal wiring (not illustrated) of each wiring substrate unit 1n or the aforementioned pad 9 via wiring for plating (not illustrated) provided between the dividing grooves 16 and the back surface 12, or between the opposite dividing grooves 16 and 18.

Next will be described a method for producing the multi-piece wiring substrate array 10a.

There were provided in advance a plurality of green sheets each having a specific thickness, and containing alumina powder and appropriate amounts of a resin binder, a solvent, etc. The green sheets were subjected to a punching process, and an electrically conductive paste containing W powder was charged into the resultant through holes. The aforementioned electrically conductive paste was applied through printing to appropriate portions of the front surface and the back surface of each of the green sheets, and then the green sheets were stacked and press-bonded together, to thereby produce a green sheet laminate gs having a front surface 11 and a back surface 12 and having a specific thickness (see FIG. 10).

Figure 10:
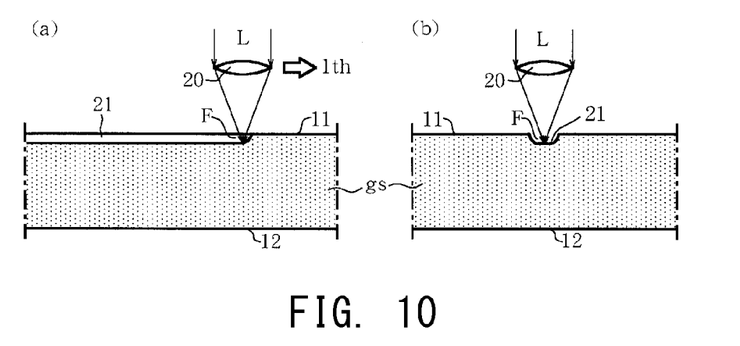
FIG. 10 schematically shows a first laser irradiation process in a method for producing the aforementioned substrate array.

In the next step, the front surface 11 of the green sheet laminate gs was irradiated and scanned a plurality of times with a laser beam L so as to form a plurality of dividing grooves 16 partitioning around the aforementioned wiring substrate units 1n and between the product region 14, and the edge portion 13, so that the grooves 16 were arranged in a lattice shape in plan view.

Specifically, as shown in FIG. 10, in the first irradiation process, while the front surface 11 of the green sheet laminate gs was irradiated with the laser beam L in a thickness direction, the laser beam L was continuously scanned along the front surface 11. The laser beam L employed was, for example, a UV-YAG laser beam. The focal point F of the laser beam L was set to a position in the vicinity of the front surface 11, and the laser beam L was scanned at a constant scan rate (about 100 mm/second). In FIG. 10, reference numeral 20 denotes a convex lens for adjusting the position of the focal point F of the laser beam L.

In the case where a dividing groove 16 having a V-shaped cross section was formed so as to have a depth of about 200 μm and an opening width of about 50 μm, irradiation of the laser beam L was carried out under the following conditions (frequency: about 30 to about 100 Hz, repetition number: 2 to 5).

Thus, as shown in FIG. 10 (on the right side), a concave groove 21 having a relatively shallow and wide cross section was formed at the aforementioned specific position. FIG. 10(a) schematically shows a direction parallel to the scanning direction of the laser beam L, and FIG. 10 (b) schematically shows a direction perpendicular to the scanning direction of the laser beam L. The same shall apply hereinafter in FIGS. 11 to 13.

Figure 11:
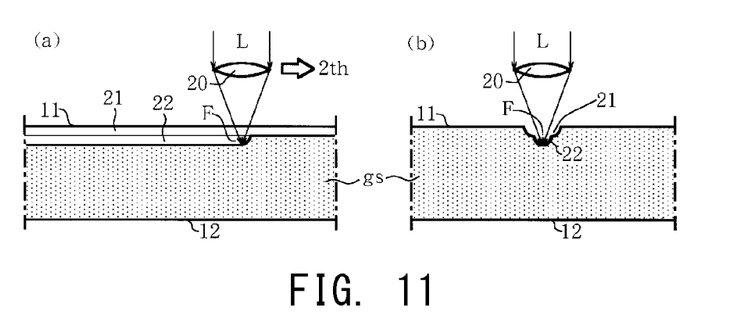
FIG. 11 schematically shows a second laser irradiation process subsequent to the process shown in FIG. 10.

Subsequently, as shown in FIGS. 11(a) and 11(b), in the second irradiation process, a center portion (in a width direction) of the concave groove 21 was irradiated with the laser beam L in a thickness direction under the same conditions as described above, and the laser beam L was continuously scanned in a longitudinal direction of the concave groove 21 so that the focal point F was set to a position in the vicinity of the bottom of the concave groove 21. Thus, as shown in FIG. 11(b), a concave groove 22 having a semi-elliptical cross section was formed in a longitudinal direction of the concave groove 21 so as to extend along the center portion of the bottom of the concave groove 21. In parallel therewith, the width of the concave groove 21 on the side toward the front surface 11 was increased by means of processing heat from the laser beam L.

Figure 12:
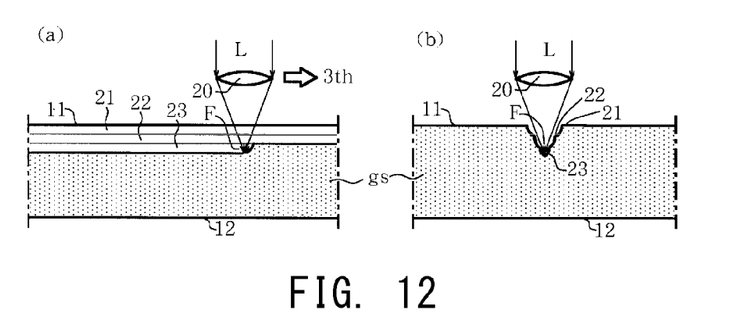
FIG. 12 schematically shows a third laser irradiation process subsequent to the process shown in FIG. 11.

Then, as shown in FIGS. 12(a) and 12(b), in the third irradiation process, a center portion (in a width direction) of the concave groove 22 was irradiated with the laser beam L in a thickness direction under the same conditions as described above, and the laser beam L was continuously scanned in a longitudinal direction of the concave grooves 21 and 22 so that the focal point F was set to a position in the vicinity of the bottom of the concave groove 22. Thus, as shown in FIG. 12(b), a concave groove 23 having a semicircular cross section was formed in a longitudinal direction of the concave grooves 21 and 22 so as to extend along the center portion of the bottom of the concave groove 22. In parallel therewith, the width of the concave groove 22 was slightly increased by means of processing heat from the laser beam L.

Figure 13:
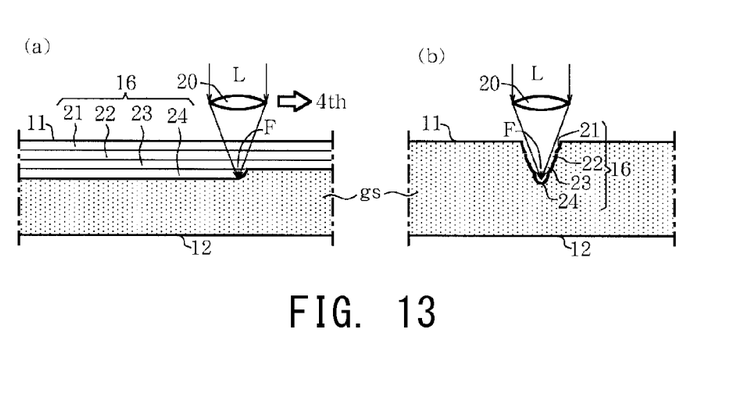
FIG. 13 schematically shows a fourth laser irradiation process subsequent to the process shown in FIG. 12.

Next, as shown in FIGS. 13(a) and 13(b), in the fourth irradiation process, a center portion (in a width direction) of the concave groove 23 was irradiated with the laser beam L in a thickness direction under the same conditions as described above, and the laser beam L was continuously scanned in a longitudinal direction of the concave grooves 21, 22, and 23 so that the focal point F was set to a position in the vicinity of the bottom of the concave groove 23. Thus, as shown in FIG. 13(b), a concave groove 24 having a semicircular cross section was formed in a longitudinal direction of the concave grooves 21, 22, and 23 so as to extend along the center portion of the bottom of the concave groove 23. The resultant concave grooves 21 to 24 became the aforementioned dividing groove 16, and a pair of opposite inner wall surfaces of the dividing groove 16 became the aforementioned inner wall surfaces 17, each including a plurality of concave portions 6 and convex portions 7 which are alternately provided in a thickness direction and are parallel to one another in a longitudinal direction.

The first to fourth laser beam L irradiation processes (i.e., a plurality of laser irradiation processes) were carried out while gradually shifting the focal point F of the laser beam L so that the depth of the focal point F, as measured from the front surface 11 of the green sheet laminate gs, in a laser irradiation process is greater than that in the preceding laser irradiation process.

The green sheet laminate gs having the lattice-shaped dividing grooves 16 formed on the front surface 11 was fired at a specific temperature, and then the resultant ceramic laminate was subjected to Ni electroplating and Au electroplating by immersing the laminate in an Ni electroplating bath and an Au electroplating bath sequentially, to thereby form an Ni plating film and an Au plating film on, for example, the surface of the aforementioned pads 9. Thus, the aforementioned multi-piece wiring substrate array 10a was produced.

According to the aforementioned multi-piece wiring substrate array 10a production method, there was reliably produced the multi-piece wiring substrate array 10a in which the dividing grooves 16 were formed on the front surface 11 of the green sheet laminate gs so as to be arranged in a lattice shape, so that the uneven surfaces 5 provided on a pair of the facing inner wall surfaces 17 were in line symmetry with each other.

No particular limitation is imposed on the number of the aforementioned laser beam L irradiation processes, so long as the processes are carried out twice or more.

The aforementioned multi-piece wiring substrate array 10b can be produced by carrying out the laser beam L irradiation processes illustrated in FIGS. 10 to 13 on the back surface 12 of the green sheet laminate gs under the same conditions as described above so that dividing grooves are formed so as to be in line symmetry with respect to those on the front surface of the green sheet laminate gs.

A plurality of unfired wiring substrates 1c can be produced directly from the green sheet laminate gs by carrying out the laser beam L irradiation processes on the front surface 11 of the green sheet laminate gs more than four times (i.e., the number of the laser beam L irradiation processes shown in FIGS. 10 to 13).

Also, a plurality of unfired wiring substrates 1d can be produced directly from the green sheet laminate gs by carrying out the laser beam L irradiation processes on each of the front surface 11 and the back surface 12 of the green sheet laminate gs more than four times (i.e., the number of the laser beam L irradiation processes shown in FIGS. 10 to 13). Each of the resultant unfired wiring substrates 1c and 1d is subjected to the aforementioned firing and plating steps.

The present invention is not limited to the above-described embodiments.

For example, the aforementioned wiring substrate or multi-piece wiring substrate array may be formed of a high-temperature fired ceramic material other than alumina (e.g., aluminum nitride or mullite), or may be formed of a low-temperature fired ceramic material other than glass-ceramic material.

Each of the aforementioned wiring substrates 1a to 1d or the wiring substrate units 1n may have a front surface 2 or 11 having a rectangular shape in plan view and a back surface 3 or 12 having a rectangular shape in plan view. In such a case, a pair of adjacent side surfaces of four side surfaces 4 or a pair of adjacent dividing grooves 16 or 18 have different lengths.

Each of the aforementioned wiring substrates 1a to 1d or the wiring substrate units 1n may have, at the center of the front surface 2 or 11, a cavity which is open on the side toward the front surface and which has four side surfaces and a bottom surface.

INDUSTRIAL APPLICABILITY

According to the present invention, there can be provided a wiring substrate which provides reliable chucking, etc. during conveyance thereof; a multi-piece wiring substrate array for providing a plurality of the wiring substrates; and a method for reliably producing the multi-piece wiring substrate array. Thus, the present invention can contribute to improvement of the productivity of ceramic wiring substrates.

DESCRIPTION OF REFERENCE NUMERALS 1a to 1d: wiring substrate
1n: wiring substrate unit
2, 11: front surface
3, 12: back surface
4: side surface
5, 5a, 5b: uneven surface
6: concave portion
7: convex portion
8: fracture surface
10a, 10b: multi-piece wiring substrate array
13: edge portion
14: product region
16, 18: dividing groove
17, 19: inner wall surface
S: ceramic laminate
w: width of uneven surface
t: thickness
gs: green sheet laminate
L: laser beam
F: focal point

What is claimed is:

1. A wiring substrate which is formed of a ceramic material, which has a rectangular shape in plan view, and which has a front surface, a back surface, and side surfaces each being located between the front surface and the back surface, the wiring substrate being characterized in that:
    each side surface has a belt-like uneven surface including a plurality of alternate and parallel convex portions and concave portions which are formed so as to extend along at least one of the front surface and the back surface, and a fracture surface located between the uneven surface and the front surface or the back surface, or between a pair of uneven surfaces provided on the side surface and located on both sides toward the front surface and the back surface.

2. A wiring substrate according to claim 1, wherein the uneven surface of each side surface has a width which is 30% or less of the overall thickness between the front surface and the back surface.

3. A multi-piece wiring substrate array comprising:
    a product region which is formed of a ceramic material, which has a front surface and a back surface and has a rectangular shape in plan view, and which has a plurality of wiring substrate units that are adjacently arranged in a matrix form;
    an edge portion which is formed of the ceramic material, which is located around the product region, and which has a front surface and a back surface and has a rectangular frame shape in plan view; and
    dividing grooves which are formed on at least one of a front surface and a back surface of the wiring substrate array and are arranged in a lattice shape in plan view, and which are provided between adjacent wiring substrate units and between the product region and the edge portion, the multi-piece wiring substrate array being characterized in that:
    each of the dividing grooves has a pair of inner wall surfaces, and each of the paired inner wall surfaces has an uneven surface including a plurality of alternate and parallel convex portions and concave portions which are formed so as to extend in a longitudinal direction of the dividing groove.

4. A method for producing a multi-piece wiring substrate array, the multi-piece wiring substrate array comprising:
    a product region which is formed of a ceramic material, which has a front surface and a back surface and has a rectangular shape in plan view, and which has a plurality of wiring substrate units that are adjacently arranged in a matrix form;
    an edge portion which is formed of the ceramic material, which is located around the product region, and which has a front surface and a back surface and has a rectangular frame shape in plan view; and
    dividing grooves which are formed on at least one of a front surface and a back surface of the wiring substrate array and are arranged in a lattice shape in plan view, and which are provided between adjacent wiring substrate units and between the product region and the edge portion, characterized in that the method comprises:
    a step of forming a plurality of dividing grooves in at least one of a front surface and a back surface of a green sheet which has a rectangular shape in plan view and which is to become the multi-piece wiring substrate array having the product region and the edge portion, by irradiating with a laser beam a plurality of times while scanning the laser beam thereon, so that the dividing grooves are provided around a portion of the green sheet corresponding to the wiring substrate units and between portions of the green sheet corresponding to the product region and the edge portion, and so that the dividing grooves are arranged in a lattice shape in plan view, wherein a plurality of laser beam irradiation processes are carried out while gradually shifting the focal point of the laser beam so that the depth of the focal point, as measured from the front surface or back surface of the green sheet, in a laser irradiation process is greater than that in the preceding laser irradiation process.

* * * * *